United States Patent
Tsai et al.

(10) Patent No.: US 7,795,083 B2
(45) Date of Patent: Sep. 14, 2010

(54) SEMICONDUCTOR STRUCTURE AND FABRICATION METHOD THEREOF

(75) Inventors: Hung-Shern Tsai, Tainan County (TW); Shang-Hui Tu, Tainan (TW); Shin-Cheng Lin, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 38 days.

(21) Appl. No.: 12/371,879

(22) Filed: Feb. 16, 2009

(65) Prior Publication Data

US 2010/0207174 A1    Aug. 19, 2010

(51) Int. Cl.
*H01L 21/337* (2006.01)
(52) U.S. Cl. .................. 438/186; 438/194; 257/272; 257/287; 257/E31.073; 257/E27.148
(58) Field of Classification Search .................. 438/437, 438/542, 545, 554, 186, 560, 194; 257/272, 257/287, 270, 134, 256, 274, E31.073, E27.148, 257/402, 487, 491–497
See application file for complete search history.

(56) References Cited

U.S. PATENT DOCUMENTS 7,279,767 B2 * 10/2007 Wu et al. .................... 257/487
2005/0285157 A1 * 12/2005 Hower et al. ................ 257/287

* cited by examiner

*Primary Examiner*—W. David Coleman
*Assistant Examiner*—Shaka Scarlett

(57) ABSTRACT

The invention provides a method for forming a semiconductor structure. A plurality of first type well regions is formed in the first type substrate. A plurality of second type well regions and a plurality of second type bar doped regions are formed in the first type substrate by a doping process using a mask. The second type bar doped regions are diffused to form a second type continuous region by annealing. The second type continuous region is adjoined with the first type well regions. A second type dopant concentration of the second type continuous region is smaller than a second type dopant concentration of the second type bar doped regions. A second type source/drain region is formed in the second type well region.

16 Claims, 5 Drawing Sheets

US 7,795,083 B2

SEMICONDUCTOR STRUCTURE AND FABRICATION METHOD THEREOF

BACKGROUND OF THE INVENTION

1. Field of the Invention

The present invention relates to a method for forming a semiconductor structure, and in particular relates to a method for forming a JFET.

2. Description of the Related Art

Junction field effect transistors (JFET) have been mostly used for analog switches and signal amplifiers; especially, low noise amplifiers.

For a field effect transistor, an electric field near a carrier channel is mostly changed by controlling a signal (or bias of a gate), resulting in the change of the channel property and current property (between a source and a drain). Thus, the field effect transistor can be used for voltage controlled variable resistance, voltage controlled current source (VCCS), etc. The channel width of the junction field effect transistor is changed by changing the width of the depletion region in the PN junction between the gate and the source/drain using the principle, whereby the function of the width of the deletion and the voltage is reversed.

In the junction field effect transistor, when voltage is applied to the gate and causes depletion region of the PN junction, the channel width is reduced. Moreover, when the gate voltage is larger than a threshold value, referred to as pinch-off voltage, and the channel disappears due to over-width of the depletion region, referred to as being pinched off, a huge electric resistance results. The present invention relates to a manufacturing method for adjusting the pinch-off voltage.

BRIEF SUMMARY OF INVENTION

A detailed description is given in the following embodiments with reference to the accompanying drawings.

The invention provides a method for forming a semiconductor structure. A plurality of first type well regions is formed in the first type substrate. A plurality of second type well regions and a plurality of second type bar doped regions are formed in the first type substrate by a doping process using a mask. The second type bar doped regions are diffused to form a second type continuous region by annealing. The second type continuous region is adjoined with the first type well regions. A second type dopant concentration of the second type continuous region is smaller than a second type dopant concentration of the second type bar doped regions. A second type source/drain region is formed in the second type well region.

The invention also provides a semiconductor structure. A plurality of first type well regions is formed on a first type substrate. A plurality of second type well regions is formed on the first type substrate. A second type continuous doped region is adjoined with the first type well regions. A second type dopant concentration of the second type continuous doped region is smaller then a second type dopant concentration of the second type well region. A second type source/drain is formed on the second type well region.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1:
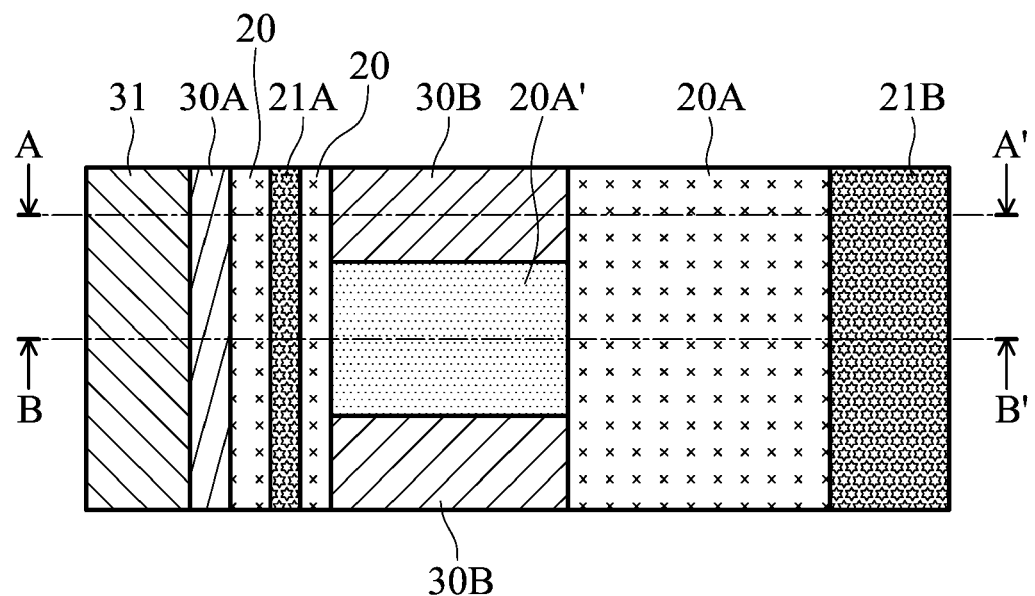
FIG. 1 is a top view of the semiconductor structure of one embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide a method for forming a semiconductor structure. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2:
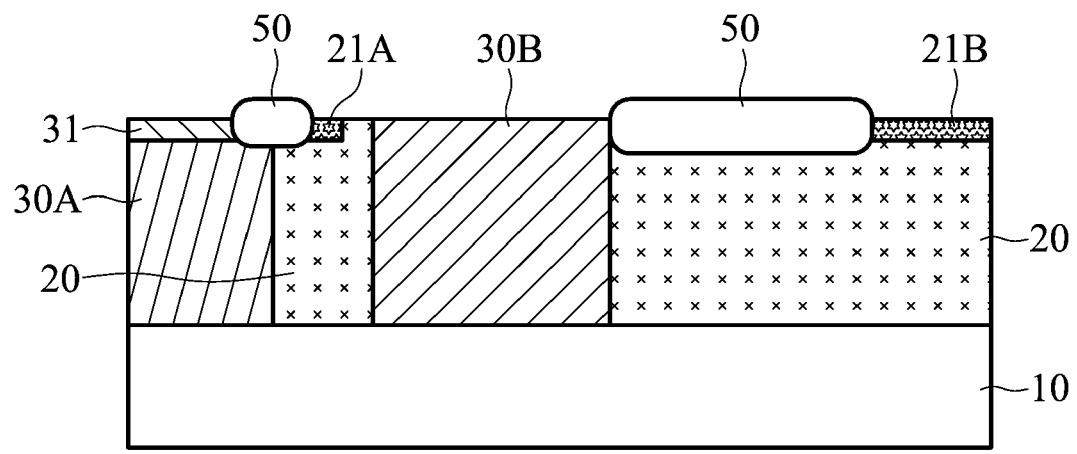
FIG. 2 is a cross-section view of the semiconductor structure along the dotted line AA' in FIG. 1.
Figure 3:
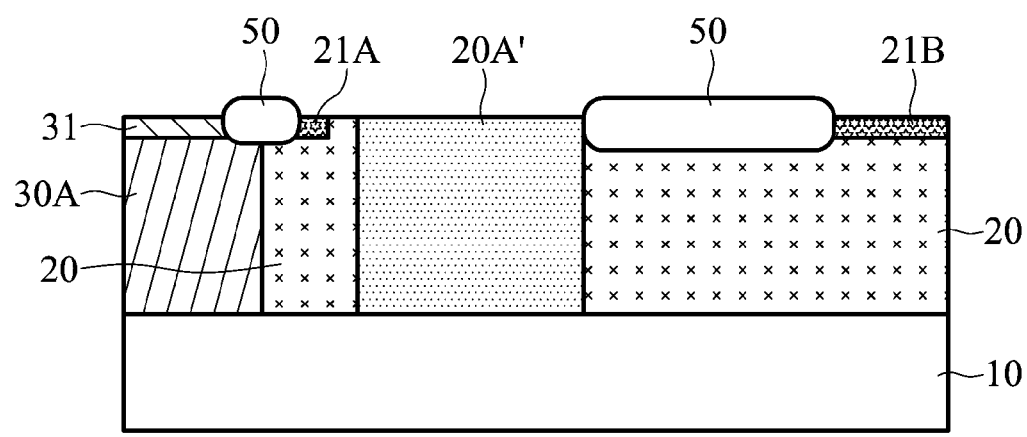
FIG. 3 is a cross-section view of the semiconductor structure along the dotted line BB' in FIG. 1.

FIG. 1 is a top view of the semiconductor structure of an embodiment of the invention. FIG. 2 is a cross-section view of the semiconductor structure along the dotted line AA' in FIG. 1. FIG. 3 is a cross-section view of the semiconductor structure along the dotted line BB' in FIG. 1.

Referring to FIG. 2 and FIG. 3, the semiconductor structure comprises a P-type substrate 10. An N-type well region 20 and P-type well regions 30A and 30B are formed in the P-type substrate 10. An isolation structure 50 is formed on the N-type well region 20 or the P-type well region 30A. Moreover, an N-type source region 21A and N-type drain region 21B are formed on the N-type well region 20. A P-type doped region 31 is formed on the P-type well region 30A. The main difference in FIG. 2 and FIG. 3 is that, on the P-type substrate 10 between the two N-type well regions 20, the P-type well region 30B is deposited in FIG. 2, and an N-type channel region 20A' is deposited in FIG. 3. It is noted that a dopant concentration of the N-type channel region 20A' is substantially smaller than a dopant concentration of the N-type well region 20.

Moreover, FIG. 1 shows the top view of the N-type well region 20, N-type channel region 20A', N-type source region 21A, N-type drain region 21B, P-type well regions 30A and 30B, and P-type doped region 31 of the semiconductor structure. The isolation structure 50 of the FIGS. 2 and 3 is omitted and not shown in FIG. 1.

Referring to FIG. 1, in one embodiment, the N-type source region 21A is connected to a source voltage $V_S$ (not shown) and is used as a source. The N-type drain region 21B is connected to a drain voltage $V_D$ (not shown) and is used as a drain. In addition, the P-type well region 30B is connected to a gate voltage $V_G$ (not shown) and is used as a gate.

Due to a lighter dopant concentration of the N-type channel region 20A', forming rate of a depletion region in the N-type channel region 20A' increases when a device made thereof is operating. In addition, the pinch-off voltage of the device decreases.

Figure 4:
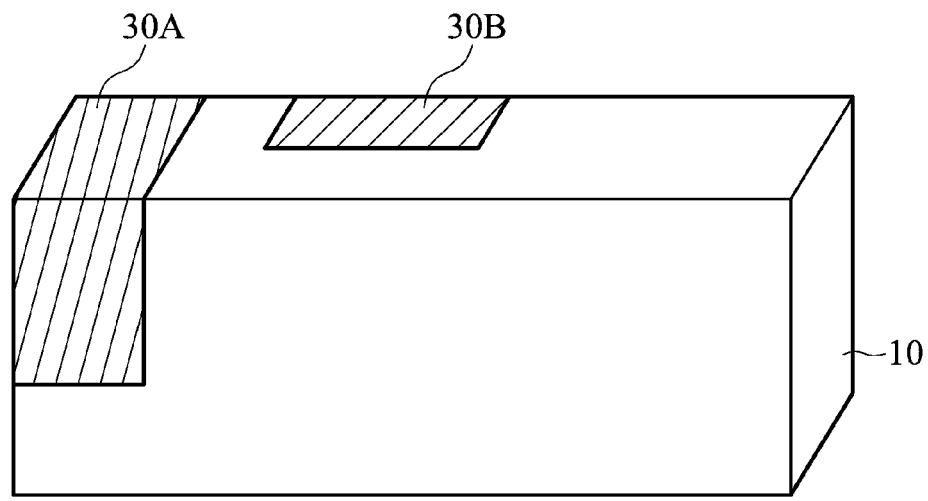
FIGS. 4 to 9 are cross-section views illustrating the method for forming the semiconductor structure of one embodiment of the invention.

FIGS. 4 to 9 are cross-section views illustrating the method for forming the semiconductor structure in FIGS. 1 to 3. Referring to FIG. 4, first, the semiconductor substrate 10 is provided. In one embodiment, the semiconductor substrate 10 may comprise a silicon-on-insulator (SOI) substrate, bulk silicon substrate, or a substrate having a silicon epitaxy layer thereon. The semiconductor substrate 10 may be a first conductive type, such as a P-type or N-type. In this example, the semiconductor substrate 10 is a P-type substrate 10.

Then, the P-type well regions 30A and 30B are formed in the P-type substrate 10. In one embodiment, the P-type well regions 30A and 30B are formed by doping P-type dopant such us boron, gallium, aluminum, indium, or combination thereof. In one embodiment, the P-type well regions 30A and 30B are simultaneously formed by performing a doping process with a patterned mask (not shown). In addition, the P-type well regions 30A and 30B have the same dopant concentrations.

Figure 5:
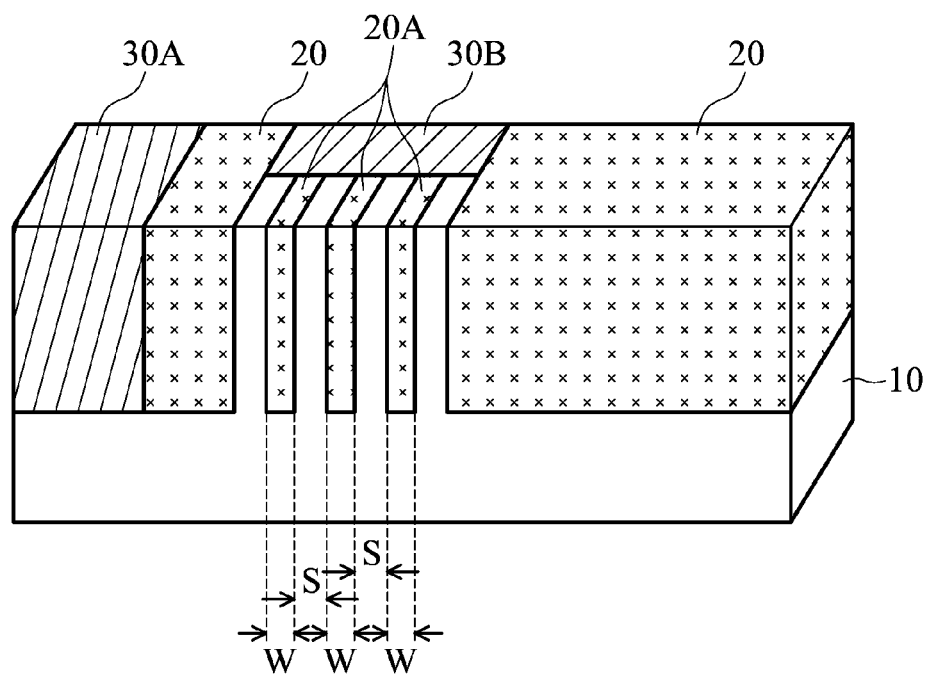

Referring to FIG. 5, the N-type well regions 20 and a plurality of N-type bar doped regions 20A are formed in the P-type substrate 10. The N-type bar doped regions 20A are deposited between the N-type well regions 20. The thicknesses W of the N-type bar doped regions 20A may be bigger than 0.5 µm. The separated distances S of the adjacent N-type bar doped regions 20A may be smaller than 10 µm. In the preferred embodiment, the thickness W and the separated distance S are substantially equal. In other embodiments, the thickness W and the separated distance S are different. The N-type well regions 20 and N-type bar doped regions 20A may be formed by doping N-type dopants such as phosphorus, arsenic, nitrogen, antimony, or combination thereof. In one embodiment, the dopant concentrations of the N-type well regions 20 and N-type bar doped regions 20A are same. In the preferred embodiment, the N-type well regions 20 and N-type bar doped regions 20A are formed at the same time by a doping process using a patterned mask (not shown), without needing extra masks and processes.

Figure 6:
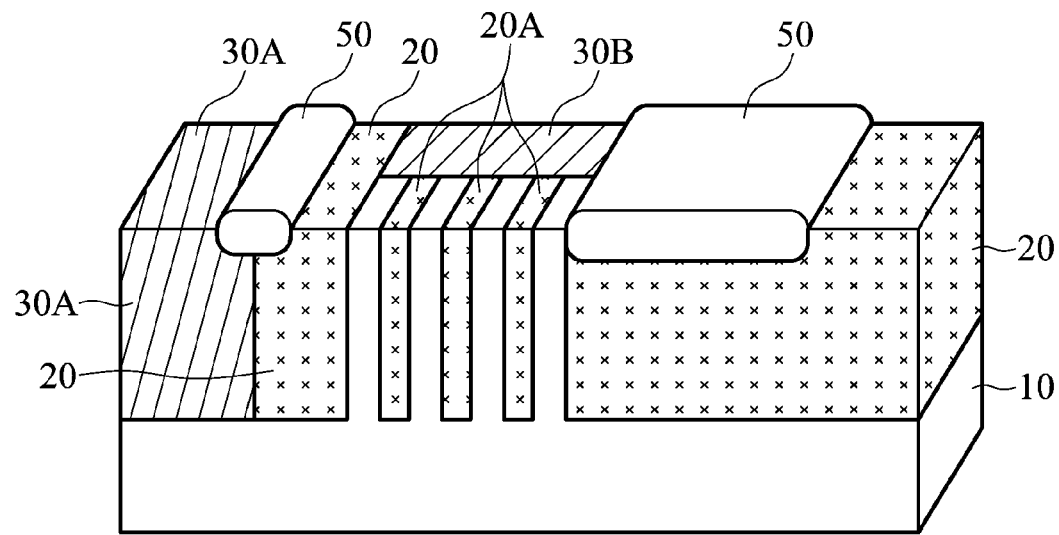

Referring to FIG. 6, the isolation structure 50 is formed on the P-type substrate 10 for defining an active region. The isolation structure 50 is not limited to the example of the field dielectric structure formed by local oxidation of silicon (LOCOS) as shown in FIG. 6. Other isolation structures 50 such as a shallow trench isolation structure may also be used.

Figure 7:
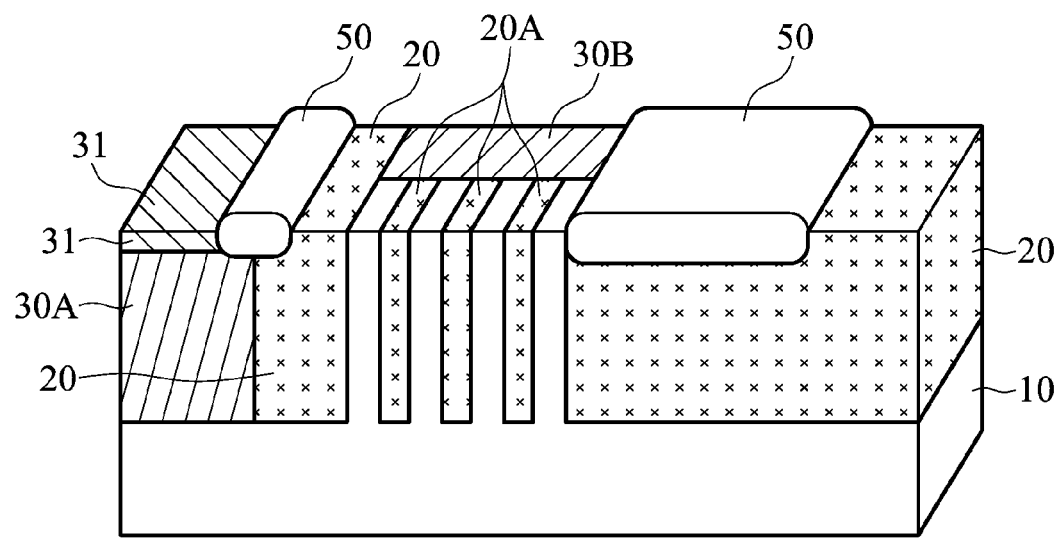

Referring to FIG. 7, the P-type doped region 31 is formed in the P-type well region 30A. The P-type doped region 31 is deposited in the upper portion of the P-type well region 30A. In one embodiment, the P-type doped region 31 may be formed by doping P-type dopants such as boron, gallium, aluminum, indium, or combination thereof. The dopant concentration may be about $1E15$ atom/cm$^2$ to about $1E16$ atom/cm$^2$. In one embodiment, the P-type doped region 31 is formed by performing a doping process with a patterned mask (not shown).

Figure 8:
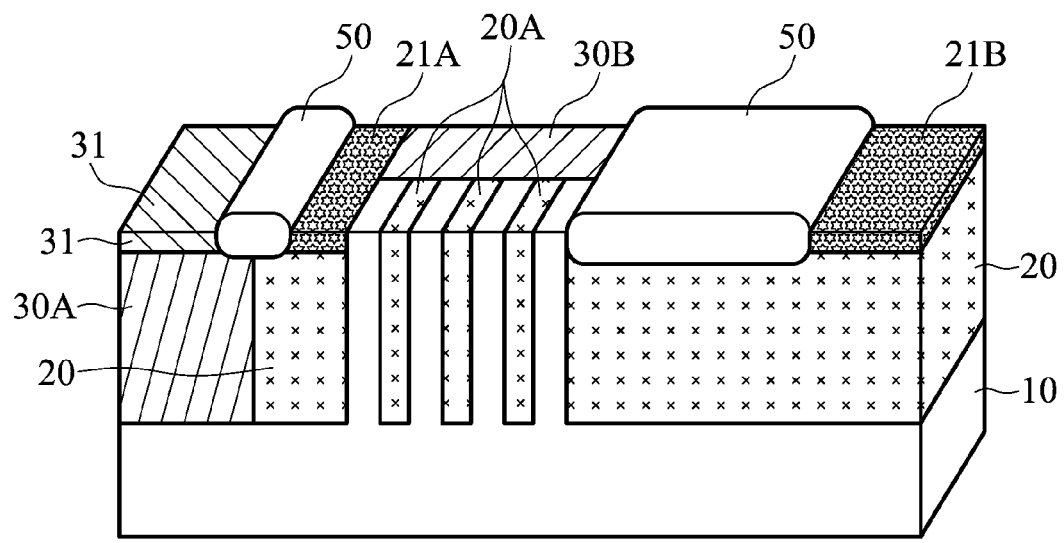

Referring to FIG. 8, the N-type source region 21A and N-type drain region 21B are respectively formed in the separated N-type well region 20. The N-type source region 21A and N-type drain region 21B are formed in the upper portion of the N-type well region 20. The N-type source region 21A and N-type drain region 21B may be formed by doping N-type dopants such as phosphorus, arsenic, nitrogen, antimony, or combination thereof. The dopant concentration may be about $1E15$ atom/cm$^2$ to about $1E16$ atom/cm$^2$. In the preferred embodiment, the N-type source region 21A and N-type drain region 21B are simultaneously formed by performing a doping process with a patterned mask (not shown).

Figure 9:
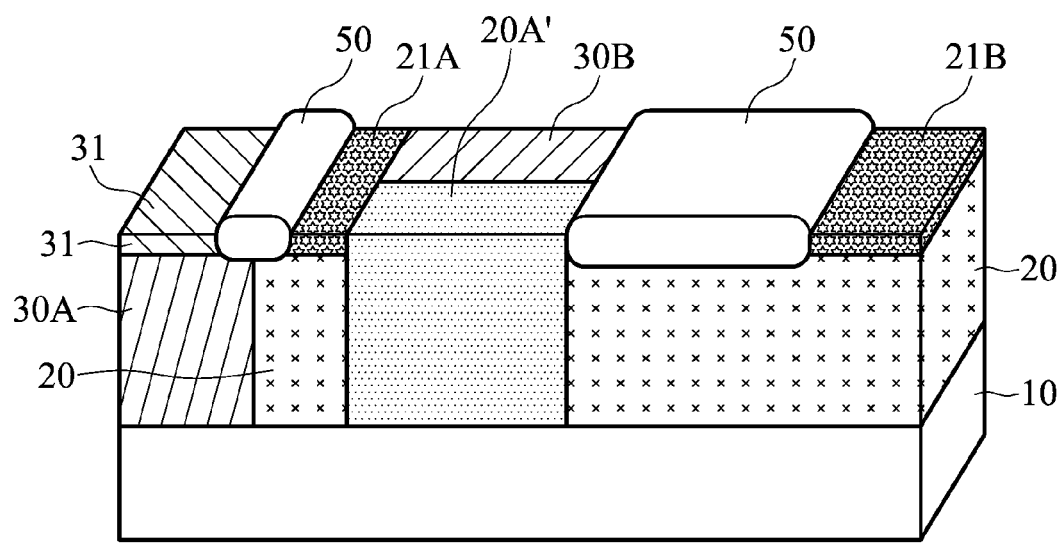

In one embodiment, an annealing step may be performed, preferably after the above described steps, for laterally diffusing the dopant of the plurality of the N-type bar doped regions 20A to join the N-type bar doped regions 20A to each other to form a continuous (or lightened) N-type well region, such as the N-type channel region 20 shown in FIG. 9. Not limited to being performed after all the elements are formed, the annealing step may be performed after forming the N-type well regions 20 and N-type bar doped regions 20A and before the subsequent steps. In other embodiments, the annealing step may be performed in any suitable condition.

It is noted that the N-type dopant concentrations of the N-type bar doped regions 20A becomes smaller when being annealed for laterally diffusing the dopant. Thus, the dopant concentration of the formed N-type channel region 20A' is lightened to be at least smaller than that of the N-type well regions 20. In one embodiment, the dopant concentration of the lightened N-type channel region 20A' may be about $1E12$ atom/cm$^2$ to about $1E15$ atom/cm$^2$.

Some advantages of the method for forming the semiconductor structure of the invention are described in the following. By lightening the dopant concentration of the N-type channel deposited between the P-type well regions, the N-type well region and the plurality of N-type bar doped regions 20A are simultaneously formed in the substrate by a doping process with a mask. Then, the N-type bar doped regions 20A are diffused to form a continuous (or lightened) N-type channel 20A' by an annealing (or thermally driving-in) step. Extra masks and process are not necessary, thus reducing costs. Furthermore, the dopant concentration of the N-type channel can be appropriately adjusted according to electrical property demands of devices, such as pinch-off voltage, by adjusting the structure or dopant concentration of the N-type bar doped regions, or adjusting the manufacturing process.

Moreover, due to the lighter dopant concentration of the N-type channel region, when operating the device, the forming rate of the depletion region is increased. Thus, the pinch-off voltage of the device becomes smaller.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). For example, when describing one embodiment of an N-channel JFET, another embodiment can be a P-channel JFET. Therefore, the scope of the appended claims should be accorded the broadest interpretation so as to encompass all such modifications and similar arrangements.

What is claimed is:

1. A method for forming a semiconductor structure, comprising:

providing a first conductivity type substrate;

forming a plurality of first conductivity type well regions in the first conductivity type substrate by doping a first conductivity type dopant in the first conductivity type substrate;

forming a plurality of second conductivity type well regions and a plurality of second conductivity type bar doped regions in the first conductivity type substrate by a doping process using a mask;

diffusing the second conductivity type bar doped regions to form a second conductivity type continuous region by annealing, wherein the second conductivity type continuous region adjoins the first conductivity type well regions, and a second conductivity type dopant concentration of the second conductivity type continuous region is smaller than a second conductivity type dopant concentration of the second conductivity type bar doped regions; and forming a second conductivity type source/drain region in the second conductivity type well region.

2. The method for forming the semiconductor structure as claimed in claim 1, wherein thicknesses W of the second conductivity type bar doped regions are bigger than 0.5 m.

3. The method for forming the semiconductor structure as claimed in claim 2, wherein a separated distance S between the adjacent second conductivity type bar doped regions is smaller than 10 μm.

4. The method for forming the semiconductor structure as claimed in claim 3, wherein the thickness W and the separated distance S are equal.

5. The method for forming the semiconductor structure as claimed in claim 3, wherein the thickness W and the separated distance S are different.

6. The method for forming the semiconductor structure as claimed in claim 1, further comprising forming a first conductivity type heavily doped region in the first conductivity type well region.

7. The method for forming the semiconductor structure as claimed in claim 1, further comprising forming an isolation structure on the second conductivity type well region.

8. The method for forming the semiconductor structure as claimed in claim 7, wherein the isolation structure is deposited on the first conductivity type well region.

9. The method for forming the semiconductor structure as claimed in claim 1, wherein the second conductivity type bar doped region is deposited between the first conductivity type well regions.

10. The method for forming the semiconductor structure as claimed in claim 9, wherein the first conductivity type well regions are deposited between the second conductivity type well regions.

11. The method for forming the semiconductor structure as claimed in claim 1, wherein each of the second conductivity type well regions and each of the second conductivity type bar doped regions are separated by the first conductivity type substrate.

12. A semiconductor structure, comprising:

a first conductivity type substrate;

a plurality of first conductivity type well regions formed in the first conductivity type substrate by doping a first conductivity type dopant in the first conductivity type substrate;

a plurality of second conductivity type well regions formed in the first conductivity type substrate;

a second conductivity type continuous doped region adjoined with the first conductivity type well regions, wherein a second conductivity type dopant concentration of the second conductivity type continuous doped region is smaller than a second conductivity type dopant concentration of the second conductivity type well region; and a second conductivity type source/drain formed in the second conductivity type well region.

13. The semiconductor structure as claimed in claim 12, further comprising a first conductivity type heavily doped region formed in the first conductivity type well region.

14. The semiconductor structure as claimed in claim 12, further comprising an isolation structure formed on the second conductivity type well region.

15. The semiconductor structure as claimed in claim 14, wherein the isolation structure is deposited on the first conductivity type well region.

16. The semiconductor structure as claimed in claim 12, wherein the first conductivity type well regions are deposited between the second conductivity type well regions.

* * * * *